US011042346B2

(12) United States Patent
Fompeyrine et al.

(10) Patent No.: US 11,042,346 B2
(45) Date of Patent: Jun. 22, 2021

(54) ARTIFICIAL COCHLEA

(71) Applicant: International Business Machines Corporation, Armonk, NY (US)

(72) Inventors: Jean Fompeyrine, Waedenswil (CH); Youri Popoff, Zurich (CH); Stefan Abel, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/526,985

(22) Filed: Jul. 30, 2019

(65) Prior Publication Data
US 2021/0034320 A1 Feb. 4, 2021

(51) Int. Cl.
| G06F 3/16 | (2006.01) |
| H04R 1/10 | (2006.01) |
| H01L 41/09 | (2006.01) |
| H04R 3/04 | (2006.01) |
| G06N 3/02 | (2006.01) |
| H03H 9/54 | (2006.01) |

(52) U.S. Cl.
CPC ............ *G06F 3/16* (2013.01); *H01L 41/0973* (2013.01); *H04R 1/1041* (2013.01); *G06N 3/02* (2013.01); *H03H 9/54* (2013.01); *H04R 3/04* (2013.01)

(58) Field of Classification Search
CPC ..... G06F 3/16; H01L 41/0973; H04R 1/1041; H04R 3/04; H03H 9/54; G06N 3/02
See application file for complete search history.

(56) References Cited

U.S. PATENT DOCUMENTS

| 5,602,080 | A | 2/1997 | Bednorz et al. | |
| 5,747,916 | A * | 5/1998 | Sugimoto | ............. H01L 41/107 310/348 |
| 9,510,106 | B2 | 11/2016 | Khenkin et al. | |
| 2014/0194673 | A1 | 7/2014 | Goldenberg et al. | |
| 2014/0247954 | A1 | 9/2014 | Hall et al. | |
| 2016/0219378 | A1 | 7/2016 | Hall et al. | |
| 2017/0229117 | A1 * | 8/2017 | van der Made | ....... G06N 3/049 |
| 2018/0332404 | A1 * | 11/2018 | Badillo | ................... H04R 19/04 |
| 2019/0034791 | A1 * | 1/2019 | Busch | ....................... G06F 3/16 |

(Continued)

FOREIGN PATENT DOCUMENTS

CN 102413407 A 4/2012

OTHER PUBLICATIONS

Tsuji et al., Artificial Cochlear Sensory Epithelium with Functions of Outer Hair Cells Mimicked Using Feedback Electrical Stimuli, Micromachines 2018, 9, 273; doi:10.3390/mi9060273, 25 pages. www.mdpi.com/journal/micromachines.

(Continued)

*Primary Examiner* — Stella L. Woo
(74) *Attorney, Agent, or Firm* — Daniel Morris; Otterstedt, Wallace & Kammer, LLP

(57) ABSTRACT

An artificial cochlea device for processing audio signals by electro-mechanical amplitude changes may be provided. The device comprises a micro-electro-mechanical system (MEMS) microphone comprising a membrane, an electro-mechanical feedback loop embedded in the MEMS microphone. Thereby, the electro-mechanical feedback loop comprises a piezo-electric actuator acting on the MEMS microphone by influencing the membrane's way to swing, such that an electro-mechanical amplitude change of an output signal is achieved.

20 Claims, 7 Drawing Sheets

(56) References Cited

U.S. PATENT DOCUMENTS

2019/0170786 A1* 6/2019 Thompson ............ G01P 15/125
2019/0229256 A1* 7/2019 Dejaeger ............. H01L 41/0973

OTHER PUBLICATIONS

Udvardi et al., Spiral-Shaped Piezoelectric MEMS Cantilever Array for Fully Implantable Hearing Systems, Micromachines 2017, 8, 311; doi:10.3390/mi8100311, 14 pages. www.mdpi.com/journal/micromachines.

Je, et al., In situ tuning of a MEMS microphone using electrodeposited nanostructures, Journal of Micromechanics and Microengineering 19.3, 2009, 8 pages.

AN4426 Application Note, Tutorial for MEMS microphones www.st.com, Feb. 2017, DocID025704 Rev 2, 20 pages.

Koickal, et al., Design of a spike event coded RGT microphone for neuromorphic auditory systems, 2011 IEEE International Symposium of Circuits and Systems (ISCAS), 2011, 4 pages.

Smith, Toward a neuromorphic microphone, Frontiers in neuroscience 9 (2015): 398, 10 pages doi: 10.3389/fnins.2015.00398.

Harris, et al., A Neuromorphic monaural sound localizer, Advances in Neural Information Processing Systems, 1999, pp. 692-698.

Neti, Neuromorphic speech processing for noisy environments, Proceedings of 1994 IEEE International Conference on Neural Networks (ICNN'94). vol. 7. IEEE, 1994 (Abstract Only).

Shintaku, et al., Development of piezoelectric acoustic sensor with frequency selectivity for artificial cochlea, Sensors and Actuators A: Physical 158.2 (2010), pp. 183-192.

Nouri, et al., A Hopf resonator for 2-D artificial cochlea: Piecewise linear model and digital implementation, IEEE Transactions on Circuits and Systems I: Regular Papers 62.4 (2015), pp. 1117-1125.

Judit Wagner, EP as ISA, Patent Cooperation Treaty, International Search Report, Intl Patent Appln. PCT/EP2020/066926, dated Oct. 1, 2020, 7 pages.

Judit Wagner, EP as ISA, Patent Cooperation Treaty, Written Opinion, Intl Patent Appln. PCT/EP2020/066926, dated Oct. 1, 2020, 8 pages.

* cited by examiner

ARTIFICIAL COCHLEA

BACKGROUND

The invention relates generally to an artificial cochlea, and more specifically, to an artificial cochlea device for processing audio signals by electro-mechanical amplitude changes. The invention relates further to a related method for operating an artificial cochlea for processing audio signals by electro-mechanical amplitude changes.

The more computing systems, sensor networks and robots become environmental-aware, the more it is required to equip these systems with proper sensors. One category of these are acoustic sensors integrated into or connected to processing systems. These are used in, e.g., speech recognition, preventive failure monitoring, human-interface systems, process control systems, ultrasonic detection and analysis, automotive/near field navigation systems, and the like. As reference—in particular in order to mimic human experiences—characteristics of ears mammals (e.g., humans) may be useful. In particular, the inner ear is enabled to provide mechanically frequency and amplitude dependent gain, e.g., an amplification of low-frequency signals or an amplification/attenuation of signal level below or above a certain level.

To simulate the human outer, middle and/or inner ear at least two components may be required: a microphone, typically built as MEMS (micro-electro-mechanical system) microphone and digital signal processing. The "biological implementation" of a frequency dependent gain relies on inner and outer hair cells with a positive feedback loop and a spatially frequency filter, "implemented" as different regions in the cochlea reacting to different frequencies. However, such a design may not be directly transformed into sensors for technical systems. Such an enhanced acoustic sensor may be denoted as artificial cochlea which should not be understood as a special form of hearing aid. However, the artificial cochlea may be used as part of a hearing aid but also in many more a wide range of other systems, as mentioned above.

In this context, the document you US 2014/0194673 A1 describes a piezoelectric transducer and methods of making the same, wherein the array includes a piezoelectric film comprising a plurality of segments. The segments can be separated by trenches in the piezoelectric film. Additionally, the document CN 102413407 A discloses middle-ear implantable miniature piezoelectric microphone and a method for preparing the same. Main components of such a device comprise piezoelectric ceramic twin lamellae and a fixed component, wherein strip-shaped piezoelectric ceramic twin lamellae of defined size, thickness and mass are used.

SUMMARY

According to one aspect of the present invention, an artificial cochlea device for processing audio signals by electro-mechanical amplitude changes may be provided. The device may comprise a micro-electro-mechanical system (MEMS) microphone comprising a membrane, and an electro-mechanical feedback loop embedded in the MEMS microphone. Thereby, the electro-mechanical feedback loop may comprise a piezo-electric actuator acting on the MEMS microphone by influencing the membrane's way to swing, such that an electro-mechanical amplitude change of an output signal is achievable.

According to another aspect of the present invention, a method for operating an artificial cochlea for processing audio signals by electro-mechanical amplitude changes may be provided. the method may comprise providing a micro-electro-mechanical system (MEMS) microphone comprising a membrane, feeding back an output signal of the MEMS microphone to the MEMS microphone in an electro-mechanical feedback loop embedded in the MEMS microphone, and stimulating a piezo-electric actuator by signals of the electro-mechanical feedback loop, wherein the piezo-electric actuator is acting on the MEMS microphone by influencing the membrane's way to swing, such that an electro-mechanical amplitude change of an output signal is achievable.

BRIEF DESCRIPTION OF THE DRAWINGS

It should be noted that embodiments of the invention are described with reference to different subject-matters. In particular, some embodiments are described with reference to method type claims, whereas other embodiments are described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be disclosed within this document.

The aspects defined above, and further aspects of the present invention, are apparent from the examples of embodiments to be described hereinafter and are explained with reference to the examples of embodiments, but to which the invention is not limited.

Figure 1:
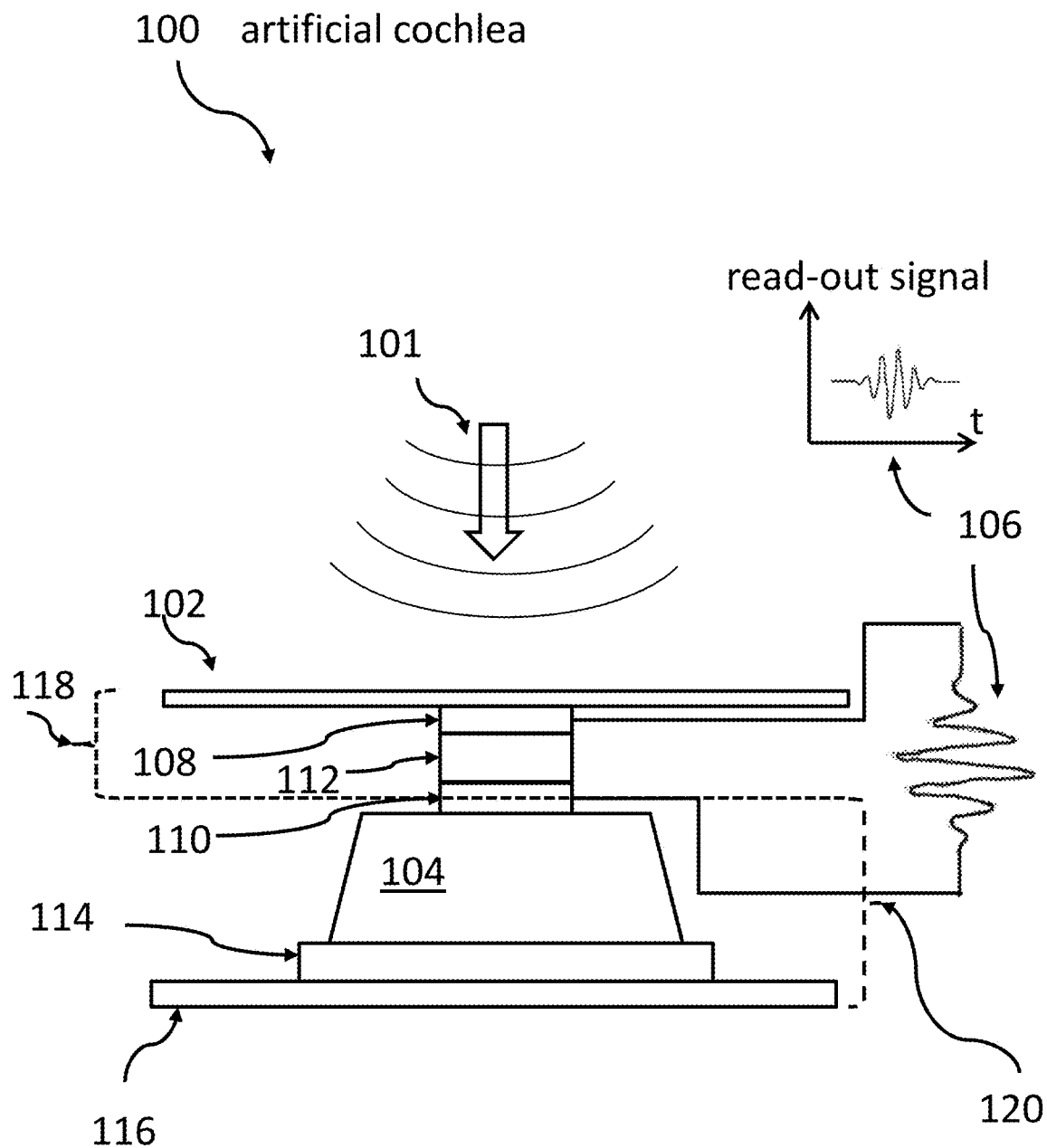

Preferred embodiments of the invention will be described, by way of example only, and with reference to the following drawings:

FIG. 1 shows a block diagram of an embodiment of the inventive artificial cochlea device.

Figure 2:
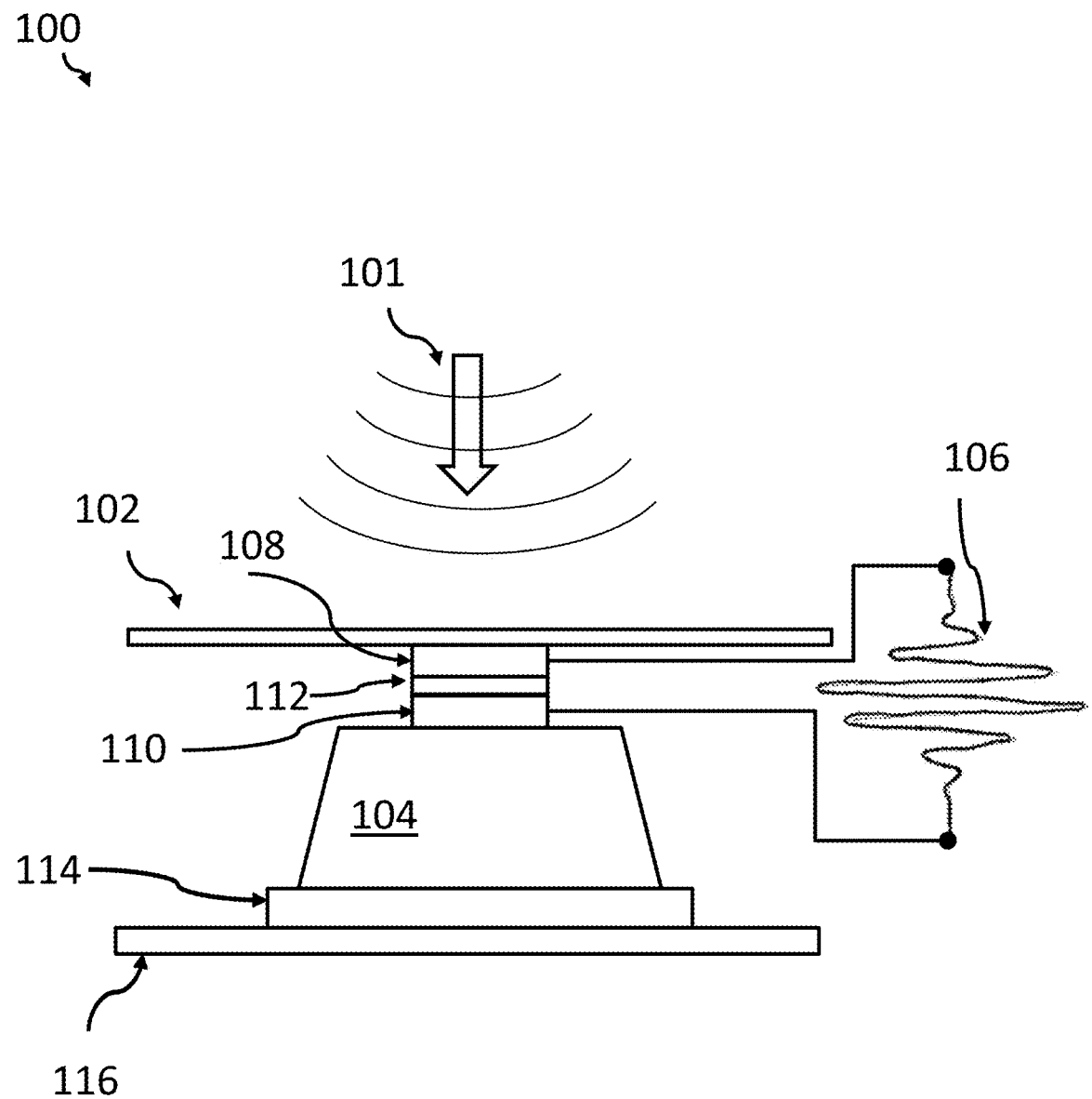

FIG. 2 shows a block diagram of an embodiment inventive of the artificial cochlea device according to FIG. 1 with sound pressure.

Figure 3:
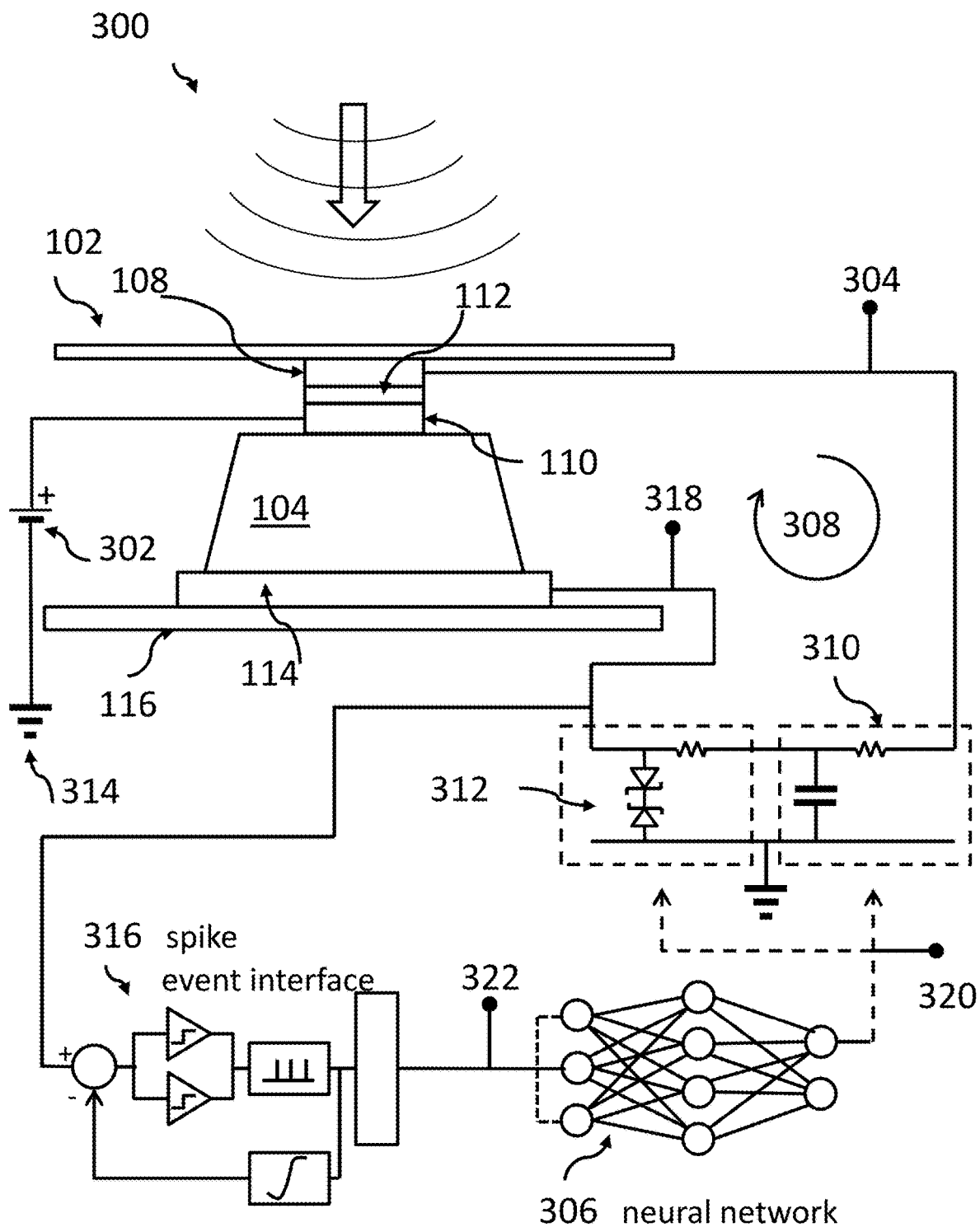

FIG. 3 shows a block diagram of an embodiment of the artificial cochlea device with a more complete passive feedback loop as well as an additional neuromorphic feedback component.

Figure 4:
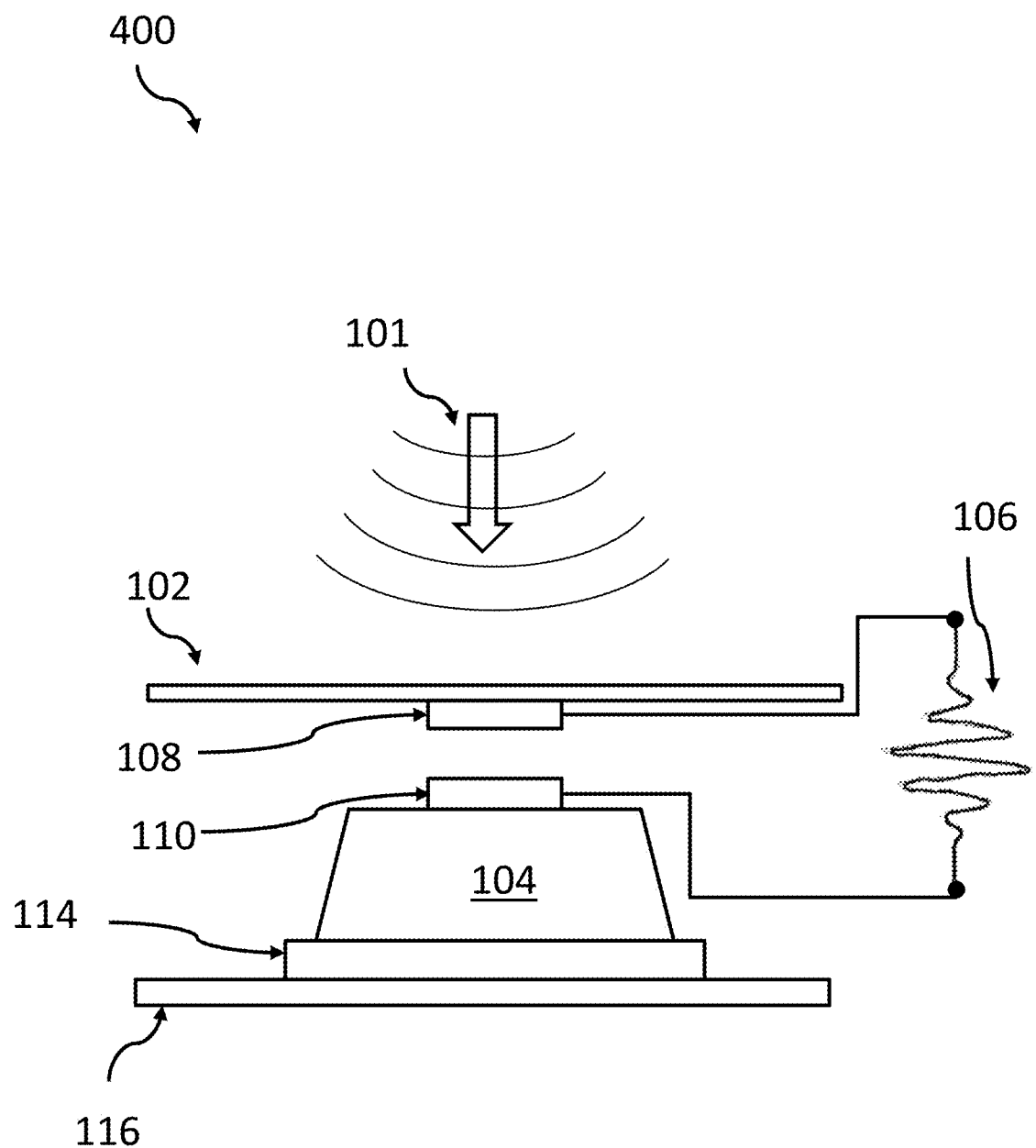

FIG. 4 shows a block diagram of an embodiment of the artificial cochlea device with a capacitor-based microphone without sound pressure.

Figure 5:
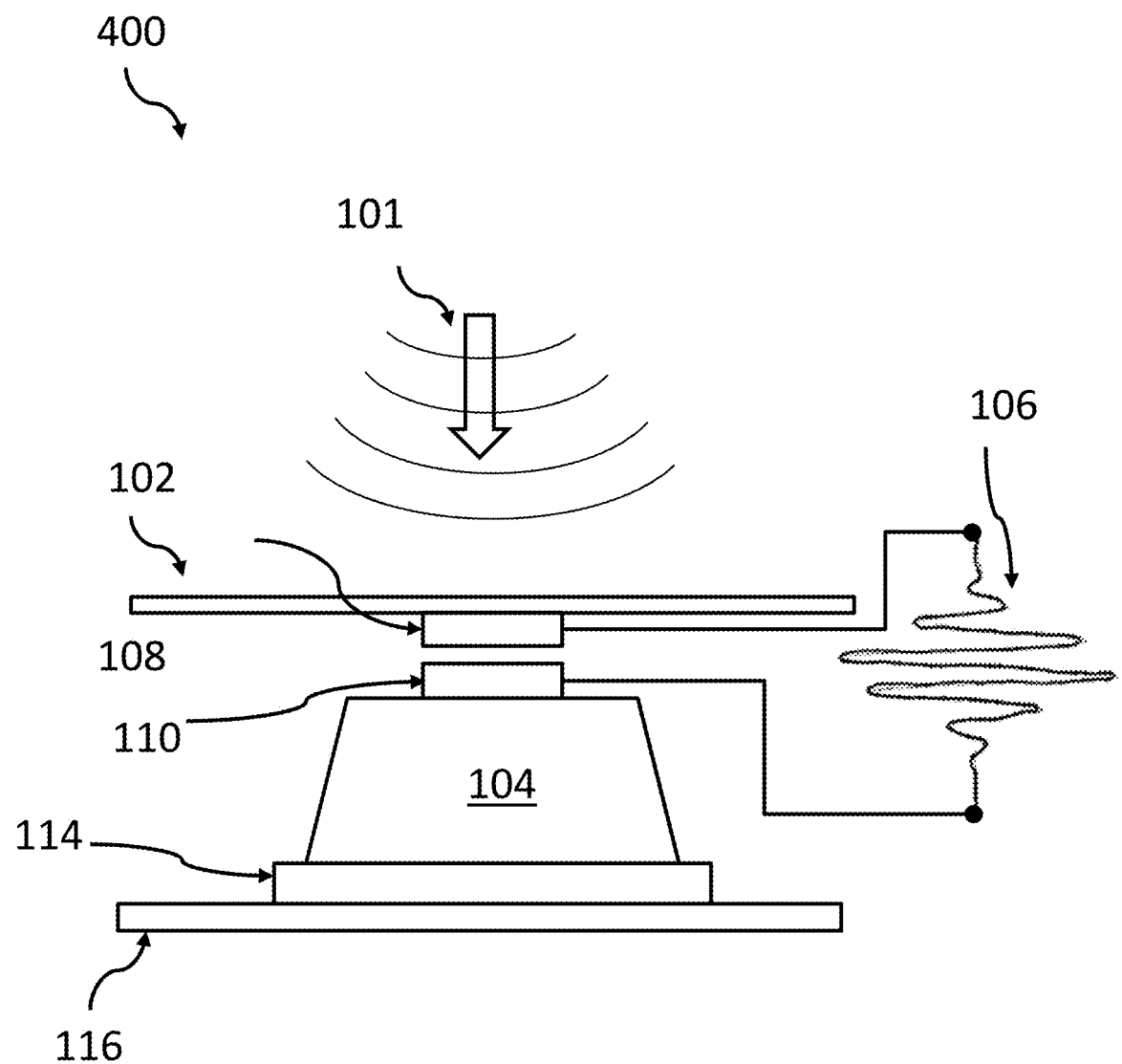

FIG. 5 shows a block diagram of an embodiment of the artificial cochlea device with a capacitor-based microphone and a piezo-electric feedback unit with sound pressure.

Figure 6:
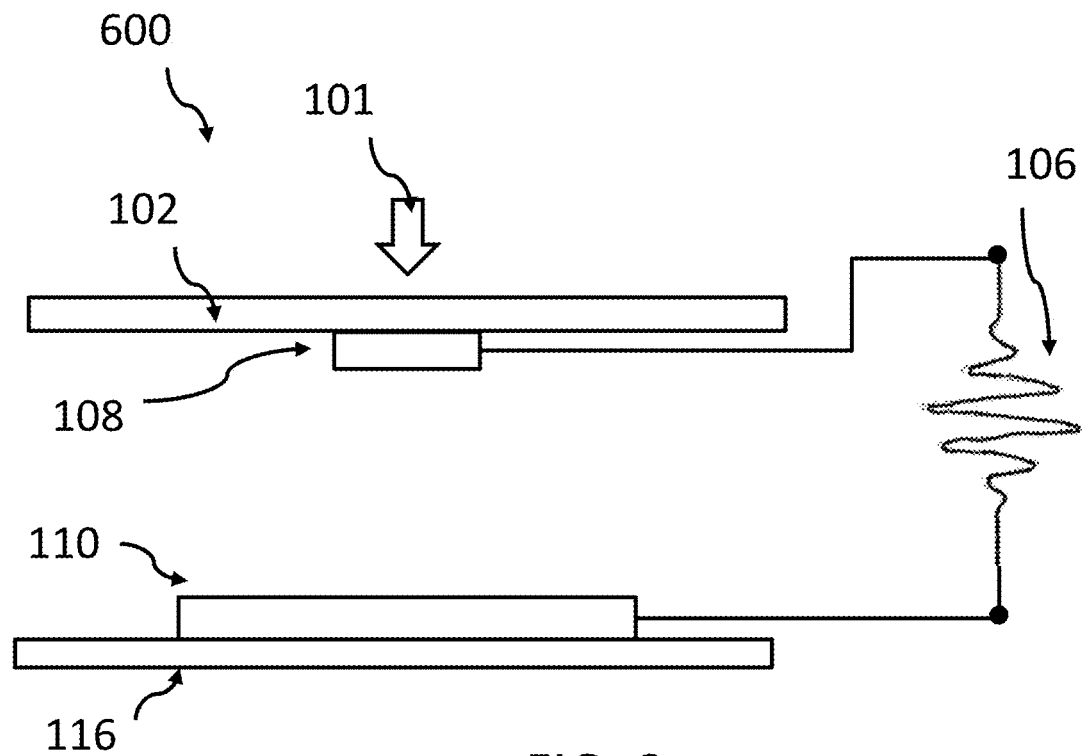

FIG. 6 shows a block diagram of another implementation of the artificial cochlea with a capacitor based microphone and an electroacoustic feedback without sound pressure.

Figure 7:
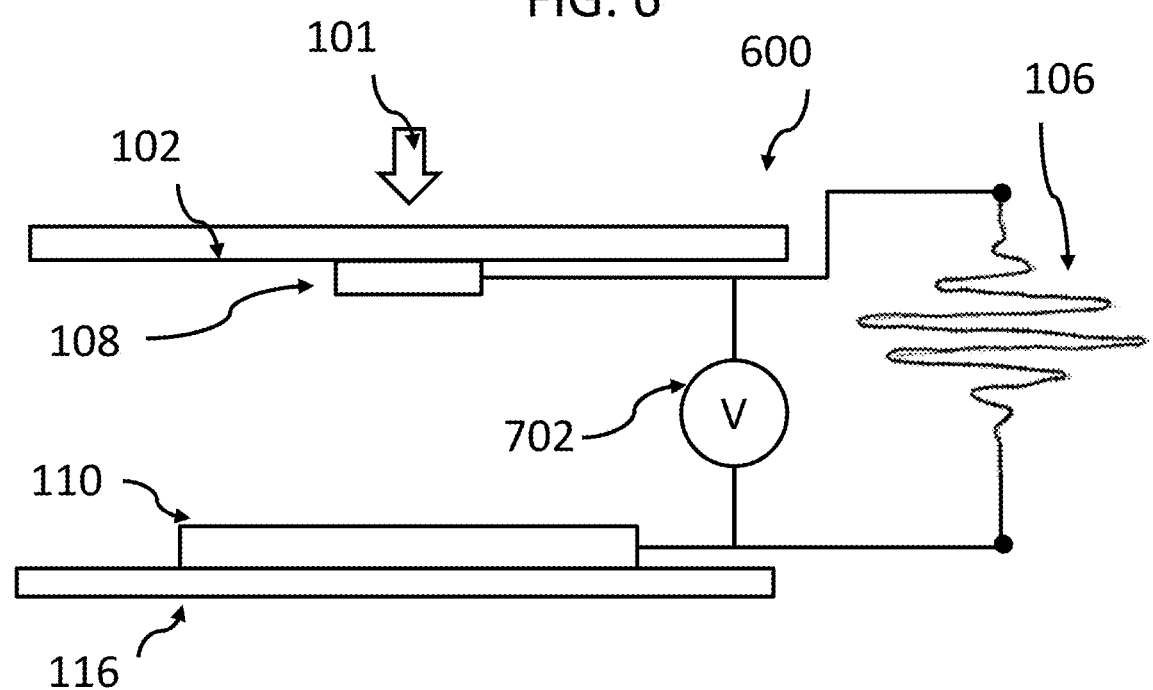

FIG. 7 shows a block diagram of another implementation of the artificial cochlea with a capacitor based microphone and an electroacoustic feedback with sound pressure.

Figure 8:
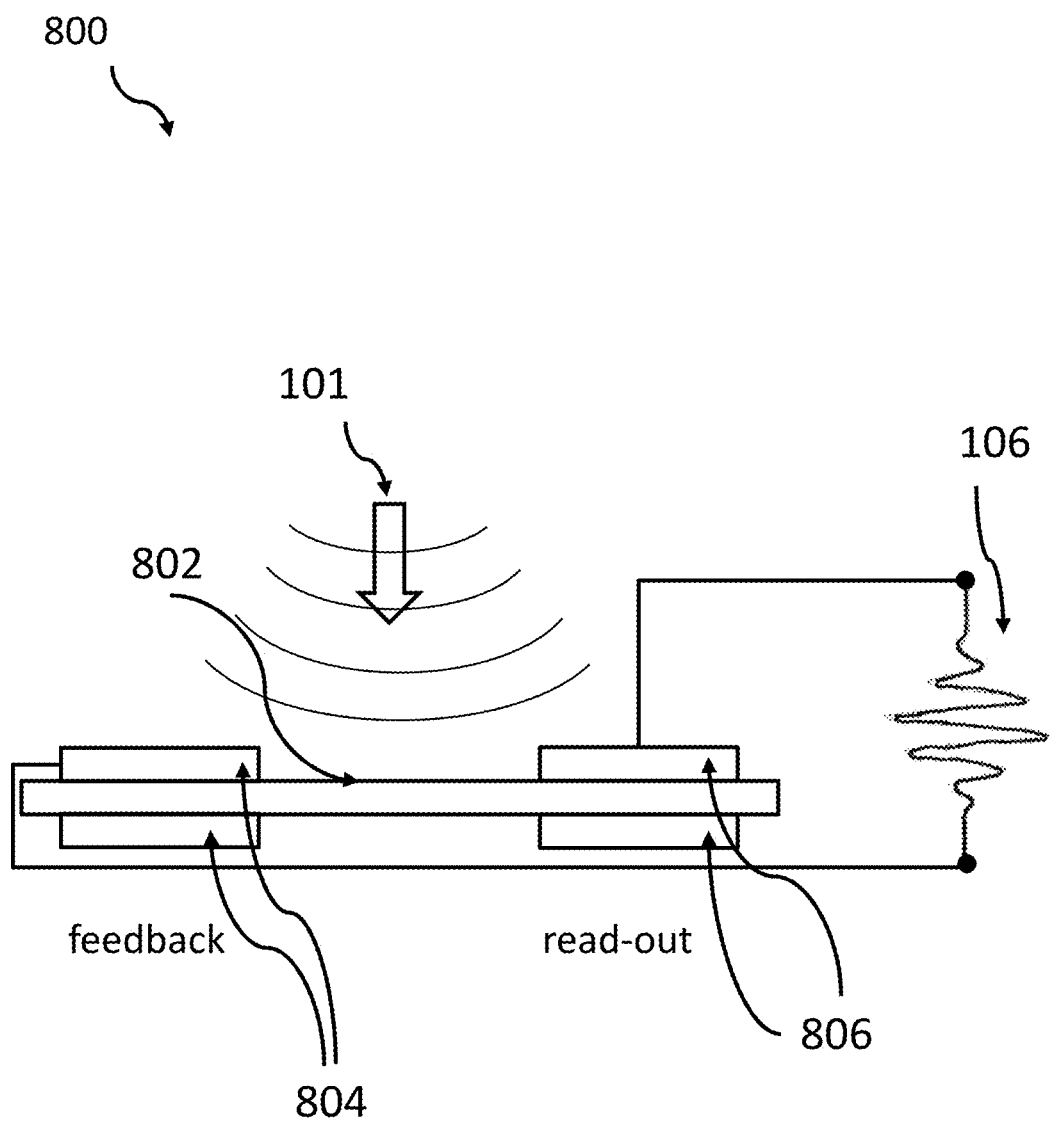

FIG. 8 shows an embodiment of a further implementation option of the inventive concept based on a piezo-electric membrane.

DETAILED DESCRIPTION

In the context of this description, the following conventions, terms and/or expressions may be used:

The term 'artificial cochlea' may denote a device representing characteristics of an electro-mechanical influence on received audio signals, i.e., an electro-mechanical amplification or an electro-mechanical attenuation.

The term 'audio signal' may denote a signal in the form of swinging air (or more general, swinging gas and/or liquids) representing any form of noise or tone or sequence of tones of different frequencies and amplitudes, i.e., an acoustic signal with an expanded frequency range. Principally, the concept may also be implementable for sound waves in solid bodies. The frequency may be either in the range of the receiving capacities of the human ear, e.g., 30 Hz to 20 kHz; or it may be an extended range of 25 Hz to 50 kHz or an even more extended range from 20 Hz to 100 kHz. Generally, the concept is not limited by any frequency limits.

The term 'micro-electro-mechanical system (MEMS) microphone' may denote a microphone—i.e., a device converting audio waves into electrical waves—implemented in the form of a micro-electro-mechanical system, often implemented in the form of a microscopic device, typically of the size of 20 μm to 1 mm with components between 1 and 100 μm in size.

The term 'electro-mechanical feedback loop' may denote that a read-out signal of, e.g., the MEMS microphone, may be fed back to a component of the MEMS microphone in order to directly influence its characteristic in a mechanical and/or electrical way.

The term 'membrane's way to swing' may denote the easiness the microphone membrane may swing under the influence of an acoustic signal. The lower the stiffness of the used material is the easier the membrane may swing to generate a read-out signal. The stiffness may be influenced by an active element directly, e.g., a piezo-electric component directly mechanically attached to a component—e.g., the lower electrode of the MEMS microphone. Thus, the excitation of the membrane by acoustic waves may be super-positioned with the waves induced by the piezo-electric component.

The term 'electro-mechanical amplitude change of an output signal' may denote an amplification of the read-out signal. Thereby, the amplification may have a positive value, i.e., a real amplification, or a negative value meaning that the function of an attenuator is realized, i.e., the signal is damped.

The term 'piezo-electric actuator' may denote an active mechanical part based on the principles of piezo-electricity that accumulates electric charge in the related material (e.g., a crystal, and the like) in response to applied mechanical stress. The underlying principle also works in the other direction, i.e., an applied electric field may be converted to stress in the material, a change in the size of the material. It may also be mentioned that instead of the piezo-electric actuator an electromagnetic actuator—or even an optically activated actuator—may be used. In general, any actuator influencing the read-out signal of the microphone may be used.

The term 'piezoresistive-based microphone' may denote a microphone type using a changing value of a resistance between two electrodes, of which one at least is swinging according to an acoustic signal.

The term 'capacitor-based microphone' may denote a microphone type using a changing capacitance of two electrodes, of which one at least is swinging according to an acoustic signal. An alternative name may be a condenser microphone.

The term 'neuromorphic feedback loop' may denote a feedback loop comprising a machine-learning unit. The input of the neuromorphic feedback loop may be directly or indirectly derived from the read-out signal, converted into a series of electrical spikes which may be used as input signals to a neural network. The neural network may be trained according to different characteristics in different frequency ranges. It may be used to reduce noise (attenuation) and amplify one or more specific frequency ranges, e.g., in order to capture spoken language of a specific person in a noisy environment (if, e.g., many people speaking in parallel)

The term 'spike event circuit' may denote an electronic circuit converting electrical signals into a series of electrical spike events of different repetition frequency. It may be used as input signals to a neural network for further analysis and feedback loop and to tune the signal processing output of the signal generation. The neural network may also be used to generate a preprocessed output of the artificial cochlea.

The proposed artificial cochlea device for processing audio signals by electro-mechanical amplitude changes may offer multiple advantages and technical effects:

The proposed artificial cochlea device—as well as the related method—may allow mimicking the functionality of the inner and outer ear of mammals. Direct electro-mechanical amplification—or also a related attenuation, in particular in certain frequency ranges—may be achieved. All components—in particular the components of the feedback loop—may be integrated into a MEMS of the microphone. Thus, a tiny, fully integrated electro-mechanical device may be built in an easy way. Especially, the frequency-dependent functionality of the device may be used in a variety of application areas, e.g., for surrounding noise reduction of active signals.

E.g., in the automotive industry, 3D ultrasonic sensors based on the proposed concept may provide low-cost, near-field vision (e.g., <5 m) of any type of autonomous vehicle. In another application field—like smart buildings—the MEMS microphone-based sensors may allow anonymous people counting and localization in rooms of buildings. For that, the sensors may be installed on the ceiling to realize reliable people tracking in various environments (retail shops, security related areas, ambient assisted living, building automation, etc.).

Also for robots, the here proposed devices may allow a better orientation in real-life environments. The MEMS microphone based sensors may enable the robots with near-field vision in an industrial or household environment. This may support collision avoidance and mapping to give the autonomous systems the ability to "see with sound".

The proposed form of audio signal processing may thus be used in the fields of speech recognition, prevent failure monitoring, human-interfaces, process control and any form of ultrasonic detection. It may also be a vehicle to implement machine-learning systems at the edges of computing, i.e., machine-learning enabled sensors to interpret received signals (e.g., acoustic signals) directly at its origin. This may reduce the amount of data to be transmitted to data concentrators and finally to larger compute units over networks with comparably low capacity.

Moreover, the additional advantages should also be mentioned: The (possibly frequency dependent) amplification and attenuation is locally implemented on the analog signal. Hence, electrical power in an analog-to-digital and digital-to-analog conversion may be saved.

The local and analog amplification/attenuation means a very fast feedback with comparable low latency. This may be beneficial for many applications requiring real-time control systems.

Due to the local feedback mechanism it may be implemented with an array of such devices. Each one of the devices may have a different frequency response.

Last but not least, a filtering of signal (as is done in the feedback loop) may correspond to an addition of noise because of the filtering circuit. The locality of the filtering feedback may limit this noise to a minimum. To do it in an analog way (as depicted in FIG. 3) may limit it as well (as opposed to e.g., DSP (digital signal processing) which may introduce quantization and sampling noise).

In the following, additional embodiments of the artificial cochlea device—in principle also applicable to the related method—are described:

According to possible embodiments of the artificial cochlea, the electro-mechanical amplitude change of the output signal may be an amplification or an attenuation. Hence, basically no electronic component may be required for the amplification. Only passive electro-technical components may be used. The attenuation may be performed to specific frequency ranges in order to cancel noise of specific frequencies.

According to one preferred embodiment of the artificial cochlea, the MEMS microphone may comprise a piezo-resistive element and wherein a bottom electrode of the MEMS microphone is mechanically coupled to the piezo-electric actuator. The piezo-resistive element may be instrumental to transform received acoustic waves into changes in electrical current (or voltage) to generate a readout signal. It may also be noted that the bottom electrode of the MEMS microphone may directly be coupled mechanically to the piezo-electric actuator so that an electrical looped back readout signal to the piezo-electric actuator may increase the pressure in the piezo-resistive element such that a higher readout (or lower in case of an attenuation) signal of the MEMS microphone may be generated. Thus, no active electronic components may be required for the signals forming influence of the looped back signal.

According to another preferred embodiment of the artificial cochlea, the MEMS microphone may be a capacitive microphone (i.e., a condenser microphone, or electrostatic microphone) and wherein the MEMS microphone—in particular, a bottom electrode of the MEMS microphone—is mechanically coupled—in particular, directly coupled—to the piezo-electric actuator. Also here, comparable to the piezo-resistive MEMS microphone, the feedback loop can directly act and influence the functioning of the MEMS microphone itself.

According to a further preferred embodiment of the artificial cochlea, the membrane of the microphone may embed piezo-electric film to which a first pair of contacts and a second pair of contacts is attached, wherein the first pair of contacts is used to actuate the piezo-electric film, and the second pair of contacts is used to form the output of the MEMS microphone. Thus, the first pair of contacts may directly influence the movement of the membrane of the MEMS microphone such that the readout signal taken from the second pair of contacts may be influenced directly and due to the speed of the feedback loop without any phase shift.

According to one advantageous embodiment of the artificial cochlea, the electro-mechanical amplification may be frequency dependent. This may be achieved by a frequency filter in the feedback loop. The filter may be a low pass filter, a high pass filter, a bandpass filter or a more complex filter of a combination of the above-mentioned filters such that specific frequency ranges may be amplified and other frequency ranges may be attenuated. Thus, a fine-tuning of the incoming signals in form of acoustic waves into electrical readout signals may be achieved elegantly.

According to one permissive embodiment of the artificial cochlea, the electro-mechanical feedback loop may comprise an amplitude forming circuit. This may be achieved by applying a non-linear function within the looped back signal. Additionally, such an amplitude forming circuit may be connected in series with a frequency filter in the feedback loop.

The amplitude forming circuit may be an amplitude clipping circuit or an amplitude smoother circuit having a non-linear characteristic. Basically, every non-linear function may be used to influence the form of the signal.

According to one enhanced embodiment, the artificial cochlea may also comprise a neuromorphic feedback loop. Such a neuromorphic feedback loop may exist in parallel, i.e., besides the electro-mechanical feedback loop. In fact, the neuromorphic feedback loop may react slower to input signals than the direct electro-mechanical (passive, i.e., with passive elements) feedback loop and may influence the characteristics of the electro-mechanical feedback loop.

Hence, and according to a further enhanced embodiment of the artificial cochlea, the neuromorphic feedback loop may be connected with the output of the electro-mechanical feedback loop and may be adapted for influencing a filter function of the electro-mechanical feedback loop. This way, a two-way, two-speed feedback loop exists enabling more or less any influence of the way the MEMS microphone operates.

According to a possible embodiment of the artificial cochlea, the neuromorphic feedback loop may comprise a spike event circuit—which may mainly operate in an analog mode—connected to a neural network. Thereby, the spike event circuit may be connected via an AER (address event representation) interface which is a neuromorphic inter-chip communication protocol designed allowing real-time connectivity between artificial neurons. Thus, the signal spikes, generated by the analog spike event circuit, may be received by the input layer of the artificial neural network. The output of the trained artificial neural network may then be used to directly influence the functioning and electrical characteristics of the frequency filter and/or the amplitude forming circuit.

According to a further possible advantageous embodiment, the artificial cochlea device may comprise a plurality of MEMS microphones instead of only one. Each of the may have other characteristics in term of amplification/attenuation and frequency dependency. Thus, the sound response at the read-out terminals may be highly adjustable to various requirements.

In the following, a detailed description of the figures will be given. All instructions in the figures are schematic. Firstly, a block diagram of an embodiment of the inventive artificial cochlea device for processing audio signals by electro-mechanical amplitude changes is given. Afterwards, further embodiments, as well as embodiments of the method for operating an artificial cochlea for processing audio signals by electro-mechanical amplitude changes, will be described.

FIG. 1 shows a block diagram of an embodiment of the inventive artificial cochlea device 100 for processing audio signals by electro-mechanical amplitude change in a ground state (no sound pressure). The artificial cochlea comprises a micro-electro-mechanical system (MEMS) microphone comprising a membrane 102, which can swing under the influence of an audio signal 101, as well as an attached piezo-resistive device (see below).

The device 100 comprises also an electro-mechanical feedback loop (not shown in this figure) embedded in the MEMS microphone. Thereby, the electro-mechanical feedback loop comprises a piezo-electric actuator—in particular comprising the lower electrode 114, the piezo-electric layer 104 and the contact 110—for acting directly on the MEMS microphone such that an electro-mechanical amplitude change of an output signal 106 is achieved. It may be noted that the output or read-out signal 106 is symbolically shown as a free-form wave. A skilled person will understand that this should represent an amplitude signal in an amplitude-to-time diagram which has been omitted due to comprehensibility reasons.

The MEMS microphone comprises in this embodiment an upper electrode 108 attached to the membrane 102 and a lower electrode 110, and in between those electrodes 108, 110 a piezo-resistive material 112 or component which changes its electrical resistance depending on a pressure applied to it. If the pressure the membrane 102 applies via the electrode 108 to the resistive material 112 is phase-aligned (more precisely shifted by 180°) with the pressure generated by the piezo-electric material (in phase and amplitude) any amplification and attenuation may be achieved. However, a small but neglectable phase-shift may exist.

Below the lower electrode 110 of the MEMS microphone (which may also be denoted as middle electrode of the complete system) a piezo-electric layer 104 is positioned atop a contact 114 which is positioned on a substrate 116. Hence, in a nutshell, the components 118 denote the components of the MEMS microphone, whereas the components 120 denote the actuator. In that, the lower layer 110 has a double function: being a contact for the MEMS microphone as well as being a contact of the actuator.

FIG. 2 shows a block diagram of the embodiment of the artificial cochlea device 100 according to FIG. 1 in an active state. In this case, an electrical voltage is applied (not shown) to the piezo-electrical element 104 such that it expands additionally compressing the piezo-resistive layer 112 (beside the acoustic wave). If the acoustic pressure on the membrane 102 and the mechanical pressure from the piezo-electrical crystal 104—under an appropriate electrical signal—are aligned (see above), the piezo-resistive material 112 is compressed more than only under the acoustic pressure 101 of the membrane 102, such that the readout signal 106 is stronger if compared to the situation with no additional pressure from the piezo-electrical material 104. Thus, the readout signal 106 is changed under electro-mechanical influence. Thereby, the influence may be positive relating to an amplification of the "pristine" microphone signal or, the influence may be negative relating to a corresponding attenuation of the microphone signal.

FIG. 3 shows a block diagram 300 of an embodiment of the artificial cochlea device with a more complete passive feedback loop, as well as an additional neuromorphic feedback component. The feedback loop 308 connects the readout contact 304 for the output signal of the MEMS microphone structurally with an electrode 114. The feedback loop may only comprise the filter 310 (exemplary shown as low pass filter) only and/or together with a signal forming filter 312 (exemplary shown as signal clipping filter).

Also the active circuit for the piezo-resistive material 112 is shown in form of a voltage source 302 connected to ground 314 on one side, and the bottom electrode 110 of the piezo-resistive material 112 on the other side. Now, the readout signal at read-out contact 304 can be measured as a changing voltage signal.

Additionally, FIG. 3 shows a spike event interface 316 whose input is also connected to the feedback loop 308, in particular to an output of the filters 310, 312. The spike event interface 316 comprises exemplary two comparators, jointly connected to a spike generation circuit from which the feedback signal fed back to the input of the spike event interface via an integrator. The output of the spike event interface—in particular via an AER TX (transmitter) interface—is input to a trained neural network 306.

The training of the neural network 306 may have been performed in a way to function as a low speed feedback loop—compared to the fast, real-time feedback loop 308—in order to influence the characteristics of the passive filters 310 and/or 312. This way, a highly adaptive feedback loop is implementable and enabled to be adapted to a large variety of different situations and application areas. In particular, by loading the neural network 306 with different parameters according to different trained models and by changing the internal parameters of the spike event interface 306, completely different filtering characteristics may be implemented with the same physical MEMS microphone.

It should be also noted that the output of the artificial cochlea can either be the electro-mechanically modified output of the readout—the contact 304, the filtered signal at the output of the filter 312, the output of the spike event interface 316, or the output 320 of the neural network 306. All these output signals offer a variety of processed signals for the usage of the cochlea in larger systems. Furthermore, alternative read-out contacts for read-out signals of the artificial cochlea are marked with reference numerals 318, 320 and 322.

FIG. 4 shows a block diagram 400 of an embodiment of the artificial cochlea device with a capacitor-based microphone in a ground state. In this embodiment, the MEMS microphone is a capacitor-based microphone (i.e., condenser microphone). It is obvious that the piezo-resistive material 112 of FIG. 1 is missing in this embodiment, because the upper electrode 108 and the lower electrode 110 act as plates of a capacitor. The changing capacitance of this capacitor may be used for a conversion to a read-out signal 106 (symbolically directly connected to the capacitor plates—in reality a sensor circuit detecting the changing capacitance would be required).

Also here, the piezo-electric material 104 can be used to influence in a feedback loop (here not shown) the relative changes of the capacitor comprising the electrodes 108, 110 if the expansion of the piezo-electric material 104 is aligned—i.e., more or less in phase—with the swinging membrane 102 under the influence of audio pressure 101.

FIG. 5 shows a block diagram of an embodiment of the artificial cochlea device 400 with a capacitor-based microphone of FIG. 4 in an active state. Here, the distance between the electrodes 108, 112 is shorter as a consequence of an expanded piezo-electric material 104 (based on a voltage applied to it, not shown). The derived readout signal 106 may consequently be larger/stronger if compared to a situation without a feedback loop based on the piezo-electric material 104.

FIG. 6 shows another implementation option 600 of the here proposed fundamental concept in a ground state. In this case, no piezo-resistive material is required at all. The electrodes 108, 110 also function as a capacitor-based microphone. However, the primary feedback loop (optionally also the secondary, slower feedback loop) may be implemented using an electrostatic actuation of the electrodes 108, 110, symbolized by the additionally applied voltage 702 between the electrodes 108, 110 in FIG. 7 (sound waves 101 omitted).

Also here, the consequence is an amplified (or attenuated) read-out signal 106. A skilled person will understand that the fundamental principle is the same as in the case of the piezo-electrically influenced MEMS microphone being based on a piezo-resistive material or a capacitor-based microphone.

FIG. 8 shows an embodiment of a further implementation option 800 of the inventive concept based on a piezo-electric membrane 802 (sound waves 101 omitted). The audio wave generated pressure 101 is influencing the piezo-electric membrane 802 having two sets of electrodes 804, 806. The electrical connections are only shown symbolically and incomplete. The left set of electrodes 804 represents the electrode pair used as a tool for of the feedback loop, whereas the right set of electrodes 806 represents the readout contacts of the piezo-electric membrane 802. Also in this implementation an electro-mechanical influence on the received audio waves in form of an application or attenuation is possible. The filtering mechanisms and principles, as shown in FIG. 3, can be implemented to all of the different implementation options (piezo-electric material based MEMS microphone, both versions of the capacitor-based microphone as well as the piezo-electric membrane version).

The descriptions of the various embodiments of the present invention have been presented for purposes of illustration, but are not intended to be exhaustive or limited to the embodiments disclosed. Many modifications and variations will be apparent to those of ordinary skills in the art without departing from the scope and spirit of the described embodiments. The terminology used herein was chosen to best explain the principles of the embodiments, the practical application or technical improvement over technologies found in the marketplace, or to enable others of ordinary skills in the art to understand the embodiments disclosed herein.

The present invention may be embodied as a system, a method, and/or under certain circumstances supported by a computer program product. The computer program product may include a computer readable storage medium (or media) having computer readable program instructions thereon for causing a processor to carry out aspects of the present invention.

The medium may be an electronic, magnetic, optical, electromagnetic, infrared or a semi-conductor system for a propagation medium. Examples of a computer-readable medium may include a semi-conductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W), DVD and Blu-Ray-Disk.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disk read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object-oriented programming language such as Smalltalk, C++ or the like, and conventional procedural programming languages, such as the "C" programming language or similar programming languages. The computer readable program instructions may execute entirely on the user's computer, partly on the user's computer as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatuses, or another device to cause a series of operational steps to be performed on the computer, other programmable apparatus or other device to produce a computer implemented process, such that the instructions which execute on the computer, other programmable apparatuses, or another device implement the functions/acts specified in the flowchart and/or block diagram block or blocks.

The flowcharts and/or block diagrams in the figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or act or carry out combinations of special purpose hardware and computer instructions.

The terminology used herein is for the purpose of describing particular embodiments only and is not intended to limit the invention. As used herein, the singular forms "a", "an" and "the" are intended to include the plural forms as well, unless the context clearly indicates otherwise. It will further be understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or steps plus function elements in the claims below are intended to include any structure, material, or act for performing the function in combination with other claimed elements, as specifically claimed. The description of the present invention has been presented for purposes of illustration and description, but is not intended to be exhaustive or limited to the invention in the form disclosed. Many modifications and variations will be apparent to those of ordinary skills in the art without departing from the scope and spirit of the invention. The embodiments are chosen and described in order to best explain the principles of the invention and the practical application, and to enable others of ordinary skills in the art to understand the invention for various embodiments with various modifications, as are suited to the particular use contemplated.

In a nutshell, the inventive concept may be summarized in the following clauses:

1. An artificial cochlea device for processing audio signals by electro-mechanical amplitude changes, the device comprising
   a micro-electro-mechanical system (MEMS) microphone, comprising a membrane,
   an electro-mechanical feedback loop embedded in the MEMS microphone,
   wherein the electro-mechanical feedback loop comprises a piezo-electric actuator acting on the MEMS microphone by influencing the membrane's way to swing, such that an electro-mechanical amplitude change of an output signal is achieved.
2. The artificial cochlea according to clause 1, wherein the electro-mechanical amplitude change of the output signal is an amplification or an attenuation.
3. The artificial cochlea according to clause 1 or 2, wherein the MEMS microphone comprises a piezo-resistive element and wherein a bottom electrode of the MEMS microphone is mechanically coupled to the piezo-electric actuator.
4. The artificial cochlea according to any of the preceding clauses, wherein the MEMS microphone is a capacitive microphone and wherein the MEMS microphone is mechanically coupled to the piezo-electric actuator.
5. The artificial cochlea according to any of the preceding clauses, wherein the membrane of the microphone embeds a piezo-electric film to which a first pair of contacts and a second pair of contacts is attached, wherein an the first pair of contacts is used to actuate the piezo-electric film and the second pair of contacts is used to form the output of the MEMS microphone.
6. The artificial cochlea according to any of the preceding clauses, wherein the electro-mechanical amplification is frequency dependent.
7. The artificial cochlea according to any of the preceding clauses, wherein the electro-mechanical feedback loop comprises a frequency filter.
8. The artificial cochlea according to any of the preceding clauses, wherein the electro-mechanical feedback loop comprises an amplitude forming circuit.
9. The artificial cochlea according to clause 8, wherein the amplitude forming circuit is a amplitude clipping circuit or an amplitude smoother circuit having a non-linear characteristic.
10. The artificial cochlea according any of the preceding clauses, also comprising a neuromorphic feedback loop.
11. The artificial cochlea according to clause 10, wherein the neuromorphic feedback loop is connected with the output of the electro-mechanical feedback loop and adapted for influencing a filter function of the electro-mechanical feedback loop.
12. The artificial cochlea according to clause 10, wherein the neuromorphic feedback loop comprises a spike event circuit connected to a neural network.
13. The artificial cochlea according to clause 11, wherein the MEMS microphone is a plurality of MEMS microphones.
14. A method for operating an artificial cochlea for processing audio signals by electro-mechanical amplitude changes, the method comprising
   providing a micro-electro-mechanical system (MEMS) microphone comprising a membrane,
   feeding back an output signal of the MEMS microphone to the MEMS microphone in an electro-mechanical feedback loop embedded in the MEMS microphone,
   stimulating a piezo-electric actuator by signals of the electro-mechanical feedback loop, wherein the piezoelectric actuator is acting on the MEMS microphone by influencing the membrane's way to swing, such that an electro-mechanical amplitude change of an output signal is achieved.

15. The method according to clause 14, wherein the electro-mechanical amplitude change of the output signal is an amplification or an attenuation.

16. The method according to clause 14 or 15, wherein the MEMS microphone comprises a piezo-resistive element or a capacitor-based microphone, wherein the method also comprises
mechanically coupling the MEMS microphone to the piezo-electric actuator.

17. The method according to any of the clauses 14 to 16, also comprising
embedding a piezo-electric film into the membrane of the microphone to which a first pair of contacts and a second pair of contacts is attached, wherein an the first pair of contacts is used to actuate the piezo-electric film and the second pair of contacts is used to form the output of the MEMS microphone.

18. The method according to any of the clauses 14 to 17, wherein the electro-mechanical amplification is frequency dependent.

19. The method according to any of the clauses 14 to 18, also comprising a neuromorphic feedback loop.

20. The method according to clause 19, wherein the neuromorphic feedback loop is connected with the output of the electro-mechanical feedback loop and adapted for influencing a filter function of the electro-mechanical feedback loop.

What is claimed is:

1. A artificial cochlea device for processing audio signals by electro-mechanical amplitude changes, said device comprising
a micro-electro-mechanical system (MEMS) microphone, comprising a membrane configured to convert an acoustic signal to an electrical signal, and
an electro-mechanical feedback loop embedded in said MEMS microphone,
wherein said electro-mechanical feedback loop comprises a piezo-electric actuator configured to mechanically act on said membrane of said MEMS microphone with an amount of force derived from and in-phase with said electrical signal converted from said acoustic signal and configured to amplify a mechanical aspect of a mechanical to electrical conversion by said MEMS microphone.

2. The artificial cochlea according to claim 1, wherein an amplitude change of an output signal is an amplification or an attenuation.

3. The artificial cochlea according to claim 2, wherein said amplification is frequency dependent.

4. The artificial cochlea according to claim 1, wherein said MEMS microphone comprises a piezo-resistive element and wherein a bottom electrode of said MEMS microphone is mechanically coupled to said piezo-electric actuator.

5. The artificial cochlea according to claim 1, wherein said MEMS microphone is a capacitive microphone and wherein said MEMS microphone is mechanically coupled to said piezo-electric actuator.

6. The artificial cochlea according to claim 1, wherein said membrane of said microphone embeds a piezo-electric film to which a first pair of contacts and a second pair of contacts is attached, wherein said first pair of contacts is used to actuate said piezo-electric film and said second pair of contacts is used to form an output signal of said MEMS microphone.

7. The artificial cochlea according to claim 1, wherein said electro-mechanical feedback loop comprises a frequency filter.

8. The artificial cochlea according to claim 1, wherein said electro-mechanical feedback loop comprises an amplitude forming circuit.

9. The artificial cochlea according to claim 8, wherein said amplitude forming circuit is an amplitude clipping circuit or an amplitude smoother circuit having a non-linear characteristic.

10. The artificial cochlea according to claim 1, further comprising a neuromorphic feedback loop.

11. The artificial cochlea according to claim 10, wherein said neuromorphic feedback loop is connected with an output of said electro-mechanical feedback loop and adapted for influencing a filter function of said electro-mechanical feedback loop.

12. The artificial cochlea according to claim 11, wherein said MEMS microphone comprises a plurality of MEMS microphones.

13. The artificial cochlea according to claim 10, wherein said neuromorphic feedback loop comprises a spike event circuit connected to a neural network.

14. A method for operating an artificial cochlea for processing audio signals by electro-mechanical amplitude changes, said method comprising:
providing a micro-electro-mechanical system (MEMS) microphone comprising a membrane configured to convert an acoustic signal to an electrical signal,
feeding back an output signal based on the electrical signal of said MEMS microphone to said MEMS microphone in an electro-mechanical feedback loop embedded in said MEMS microphone, and
stimulating a piezo-electric actuator based on the output signal by signals of said electro-mechanical feedback loop, wherein said piezo-electric actuator is mechanically acting on said membrane of said MEMS microphone with an amount of force derived from and in-phase with said electrical signal converted from said acoustic signal and configured to amplify a mechanical aspect of a mechanical to electrical conversion by said MEMS microphone.

15. The method according to claim 14, wherein an amplitude change of an output signal is an amplification or an attenuation.

16. The method according to claim 15, wherein said amplification is frequency dependent.

17. The method according to claim 14, wherein said MEMS microphone comprises a piezo-resistive element or a capacitor-based microphone, wherein said method further comprises mechanically coupling said MEMS microphone to said piezo-electric actuator.

18. The method according to claim 14, further comprising embedding a piezo-electric film into said membrane of said microphone to which a first pair of contacts and a second pair of contacts is attached, wherein said first pair of contacts is used to actuate said piezo-electric film and said second pair of contacts is used to generate an output of said MEMS microphone.

19. The method according to claim 14, wherein the artificial cochlea which is operated further comprises a neuromorphic feedback loop.

20. The method according to claim 19, wherein said neuromorphic feedback loop is connected with an output of said electro-mechanical feedback loop and adapted for influencing a filter function of said electro-mechanical feedback loop.

\* \* \* \* \*